United States Patent [19]
Lee

[11] Patent Number: 6,136,650
[45] Date of Patent: Oct. 24, 2000

[54] METHOD OF FORMING THREE-DIMENSIONAL FLASH MEMORY STRUCTURE

[75] Inventor: Robin Lee, Hsinchu Hsien, Taiwan

[73] Assignees: United Semiconductor Corp; United Microelectronics Corp, both of Hsinchu, Taiwan

[21] Appl. No.: 09/422,626

[22] Filed: Oct. 21, 1999

[51] Int. Cl.[7] .................................................. H01L 21/336
[52] U.S. Cl. ............................................. 438/257; 438/266
[58] Field of Search ..................................... 438/257, 258, 438/259, 263, 264, 265, 266, 267

[56] References Cited

U.S. PATENT DOCUMENTS

| | | | |
|---|---|---|---|
| 5,874,760 | 2/1999 | Burns, Jr. et al. | 257/315 |
| 5,962,890 | 10/1999 | Sato | 257/320 |
| 5,966,602 | 2/1999 | Kawazu et al. | 438/258 |

*Primary Examiner*—Charles Bowers
*Assistant Examiner*—Jack Chen
*Attorney, Agent, or Firm*—Thomas, Kayden, Horstemeyer & Risley

[57] ABSTRACT

A three-dimensional flash array structure and the fabrication method thereof. The three-dimensional flash memory array structure disclosed in the invention can be expanded volumetrically, so that a memory cell with large capacity can be manufactured in a unit area to increase the memory capacity.

14 Claims, 3 Drawing Sheets

METHOD OF FORMING THREE-DIMENSIONAL FLASH MEMORY STRUCTURE

BACKGROUND OF THE INVENTION

1. Field of Invention

The present invention relates to a flash memory and the fabrication method thereof. More particularly, the present invention relates to a three-dimensional flash array structure and the fabrication method thereof.

2. Description of Related Art

In the conventional flash memory structure, a gate comprises a floating gate for storing charges, and a control gate for controlling the data access. The floating gate is located between the control gate and the substrate, with the floating gate being in a floating state and isolated from other circuits while the control gate is connected to a word line. Each flash memory cell also has a drain connected to the bit line so as to control the flash memory cell.

Among many memory cell structures, an ETOX cell having a stacked gate is the most popular type of all, and it is programmed using a channel hot-electron (CHE) which passes through a source as well as a channel region and is erased through a Fowler-Nordheim (FN) tunneling effect.

However, the ETOX cell has a two-dimensional array structure with a smaller memory capacity in its unit area, so the memory capacitance is not easily increased.

Furthermore, the device integration can not be effectively increased with an isolation structure forming between the devices.

SUMMARY OF THE INVENTION

The invention provides a three-dimensional array structure that allows programming and erasing of a single bit. The three-dimensional array structure has a plurality of memory cells formed in the substrate, wherein each memory cell includes a control gate and a floating gate formed on the control gate, wherein the floating gate and the control gate are isolated from each other. The memory cell also includes a word line formed between and isolated from the floating gate and the control gate, wherein the word line includes $n^+$ regions and $p^+$ regions. The $n^+$ regions are formed in the portion of the word line not stacked with the floating gate, and the $p^+$ regions are formed in the portion of the word line below the floating gate. The $n^+$ regions in this case serve as virtual source/drain (S/D) regions, and the $p^+$ regions also serve as virtual S/D regions. The memory cell further includes a bit line formed on the floating gate, wherein the bit line is isolated from the floating gate.

As embodied and broadly described herein, the invention provides a three-dimensional flash array structure with a plurality of memory cells. The memory cells are arranged in a three-dimensional manner of which a plurality of memory cells are arranged in rows and columns with the memory cells stacked above the rows and columns. The method for stacking the memory cells includes repetitive stacking and stacking with common control gates. Since the common control gates are provided for stacking, the three-dimensional memory array structure mentioned above can be manufactured in a reverse fashion. As a result, steps involved in the process and height of the stack are reduced in number. In addition, the three-dimensional memory array structure disclosed in the invention has its memory body separated from periphery circuits. Thus, the whole process is simplified.

According to another aspect of the invention, a fabrication method for a three-dimensional flash array structure is provided. A substrate is provided with a first oxide layer formed thereon. Control gates are formed and disposed evenly on the first oxide layer, followed by forming a planarized second oxide layer on the oxide layer at both sides of the control gates until the surface of the second oxide layer is level with the surface of the control gates. A first dielectric layer is formed on the control gates and the second oxide layer. Word lines are formed and disposed evenly on the first dielectric layer, wherein the orientation of the word lines is approximately perpendicular to that of the control gates. A planarized third oxide layer is formed on the first dielectric layer at both sides of the word lines until the surface of the third oxide layer is level with the surface of the word lines. A tunneling oxide layer is then formed to cover the word lines and the third oxide layer, while floating gates are formed on the tunneling oxide layer and where the control gates stack on the word lines. With the floating gates serving as implantation masks, an ion implantation step is performed to form virtual source/drain regions at portions of the word lines not covered by the floating gates and virtual channel regions at portions of the word lines below the floating gates. A planarized fourth oxide layer is formed on the tunneling layer at both sides of the floating gates until the surface of the fourth oxide layer is approximately level with the surface of the floating gates. A second dielectric layer is formed on the floating gates and the fourth oxide layer. Bit lines are formed on the second dielectric layer, wherein the orientation of the bit lines is approximately parallel to that of the control gates. Lastly, a planarized inter-polysilicon dielectric (IPD) layer is formed to cover the second dielectric layer and the bit lines.

Since process steps of the invention can be repeated to expand the structure volumetrically, the memory cell with a larger capacity can be manufactured in a unit area to increase the memory capacity.

In addition, it is not necessary to manufacture isolation structures and pre-defined well regions in the fabrication method for the three-dimensional flash array structure disclosed in the invention, so the process steps are simplified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
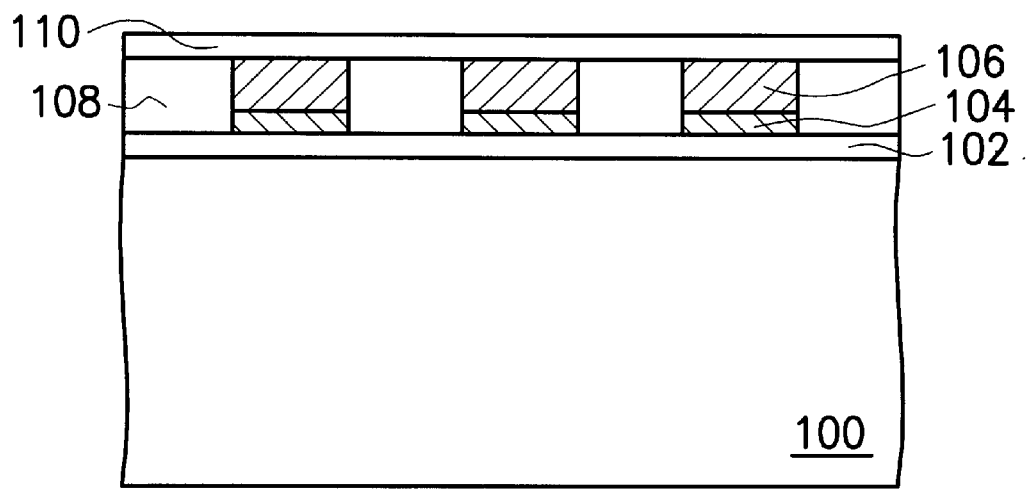
FIG. 1A through FIG. 1C are cross-sectional schematic diagrams illustrating steps of fabricating a three-dimensional flash array structure according to one preferred embodiment of this invention.
Figure 1B:
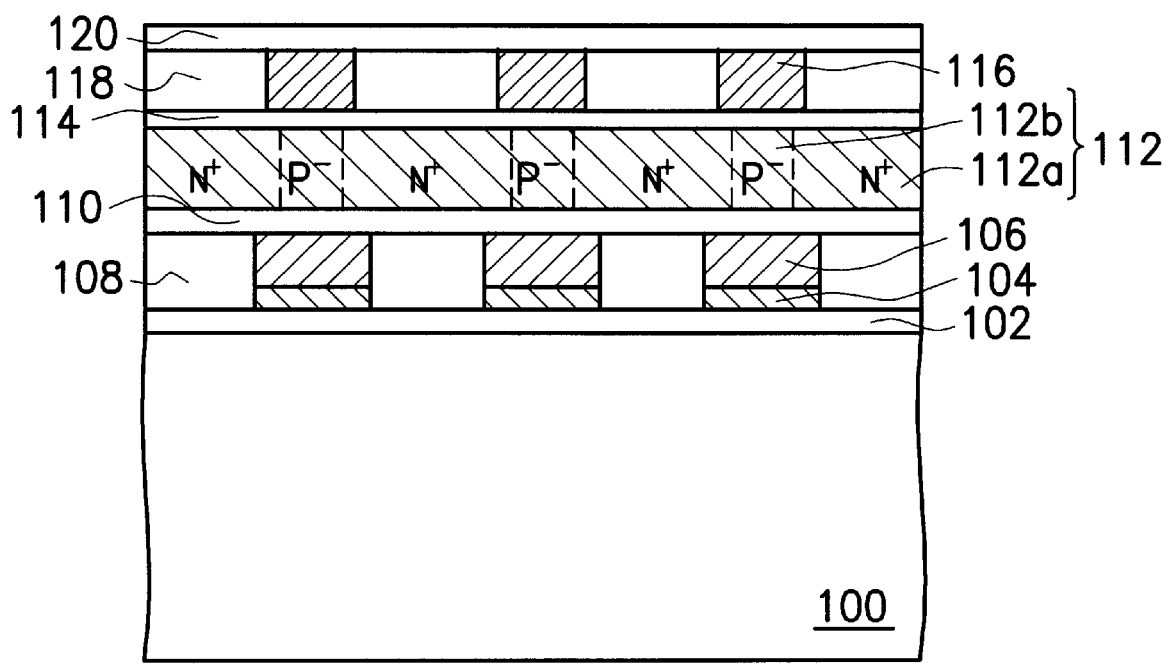
Figure 1C:
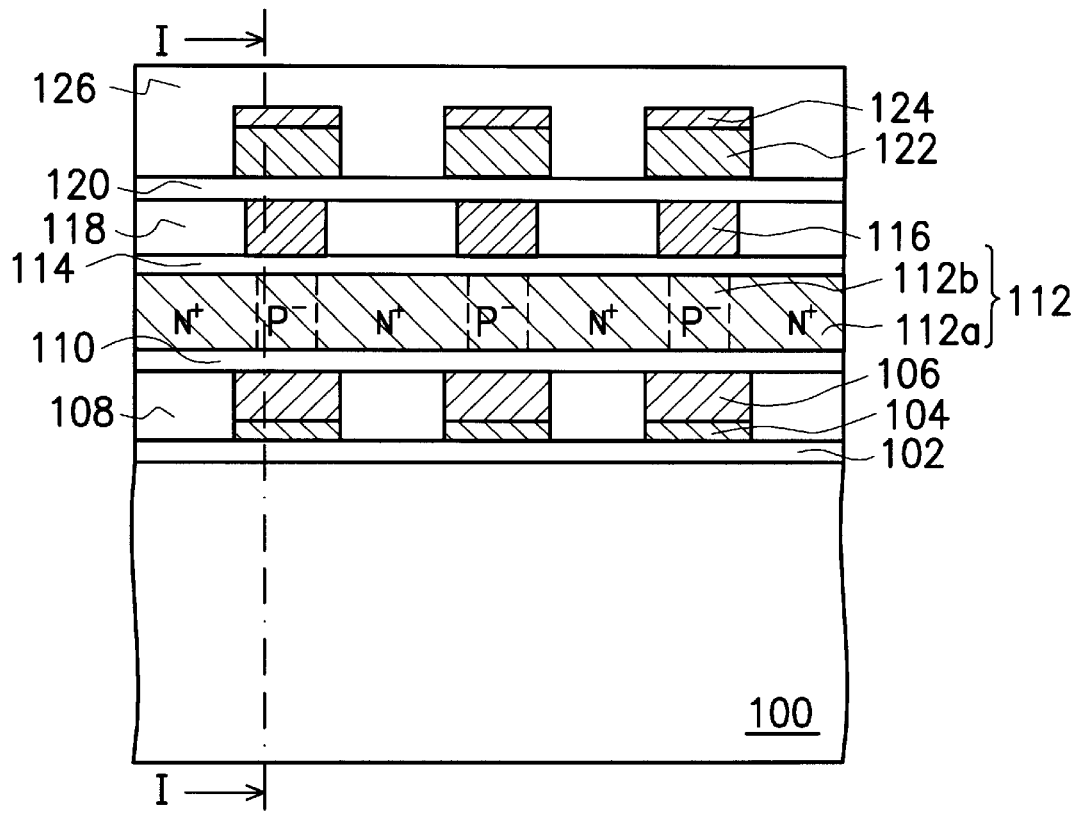

FIG. 1A through FIG. 1C are cross-sectional diagrams illustrating steps of fabricating a three-dimensional flash array structure according to one preferred embodiment of this invention.

Referring to FIG. 1A, a substrate 100, such as a semiconductor or glass substrate is provided. An oxide layer 102 is formed on the substrate 100, followed by forming a metal silicide layer and a conducting layer in sequence on the oxide layer 102, wherein the metal silicide layer includes tungsten silicide, and the conducting layer includes doped polysilicon. The metal silicide layer and the conducting layer are patterned to form conducting billets 106 and metal silicide billets 104 as shown in the diagram, wherein the conducting billets 106 and the metal silicide billets 104 constitute control gates. An oxide layer 108 is formed on the oxide layer 102 and on both sides of the conducting billets until the surface of the oxide layer 108 is level with the surface of the conducting billets 106.

Alternatively, an oxide layer is formed on the substrate 100, followed by patterning the oxide layer so as to form a plurality of billet-shaped openings in the oxide layer. The openings are filled with a metal silicide layer and a conducting layer to form billet-shaped control gates.

A dielectric layer 110 is formed to cover the conducting billets 106 and the oxide layer 108, wherein the dielectric layer 110 includes an oxide/nitride oxide (ONO) layer formed by, for example, thermal oxidation.

Referring to FIG. 1B, a conducting layer is formed on the dielectric layer 110, wherein the conducting layer includes doped polysilicon, and preferably includes p-type polysilicon in this embodiment. The conducting layer is patterned to form conducting billets 112 with their orientation perpendicular to that of the conducting billets 106, wherein each of the conducting billets 112 may serve as a word line.

A planarized oxide layer 113 (FIG. 2) is formed on the dielectric layer 110 and on at both sides of the conducting billets 112 until the surface of the oxide layer 113 is level with the surface of the conducting billets 112. An oxide tunneling layer 114 is formed to cover the conducting billets 112 and oxide layer 113, wherein the tunneling oxide layer 114 is formed by, for example, thermal oxidation. A conducting layer is formed on the tunneling oxide layer 114, wherein the conducting layer includes doped polysilicon. The conducting layer is patterned to form conducting blocks 116 on a stack of the conducting billets 106 and 112, wherein the conducting blocks 116 may serve as floating gates.

With the conducting blocks 116 serving as implant masks, an ion implantation step is performed to form n$^+$ regions 112a, i.e. virtual source/drain (S/D) regions, in portions of the conducting billets not covered by the conducting blocks 116. The ions involved in the ion implantation step may have N-type conductivity. A drive-in process is then performed to allow diffusion of the n$^+$ region to portions of the conducting billets 112 covered by the conducting blocks 116, while the remaining portions of the conducting billets 112 below the conducting blocks 116 are p$^+$ regions 112b, i.e., virtual channels.

According to the invention, each billet-shaped conducting layer 112 is doped to form n$^+$ regions and p$^-$ regions, with floating gates serving as implantation masks. An appropriate thermal process, such as a drive-in process, is performed until portions of the n+ regions are covered by the floating gates. As a result, the channel length is reduced to increase the operation rate of the device, while the required voltage is reduced with an accompanying reduction in heat generation. This improves the operating capacity and improves efficiencies in programming and erasing at the same time. Also, each of the control gates is wider than the p$^-$ region, so that disturbance produced as a result of abnormal operation of the virtual NMOS is prevented, when misalignment occurs during photolithography.

An oxide layer is formed and planarized to form the oxide layer 118 on the tunneling oxide layer at both sides of the block-shaped conducting layers 116 until the surface of the oxide layer 118 is level with the surface of the block-shaped conducting layers 116. A dielectric layer 120 is formed on the block-shaped conducting layers 116 and the oxide layer 118, wherein the dielectric layer 120 may include an oxide/nitride/oxide (ONO) layer formed by thermal oxidation.

Referring to FIG. 1C, a conducting layer and a metal silicide layer are formed in sequence on the dielectric layer 120, wherein the conducting layer includes doped polysilicon, and the metal silicide layer includes tungsten silicide. The conducting layer and the metal silicide layer are patterned to form conducting billets 122 and metal silicide billets 124, while the conducting billets 122 and the metal silicide billets 124 are approximately parallel to and stacked on the control gates. The conducting billets 122 and the metal silicide billets 124 in this case constitute bit lines.

An inter-polysilicon dielectric (IPD) layer is formed to cover the dielectric layer 120 and the bit lines, before the IPD layer is planarized by, for example, chemical mechanical polishing (CMP) in order to form the IPD layer 126. The IPD layer 126 in this case may include an oxide layer.

Figure 2:
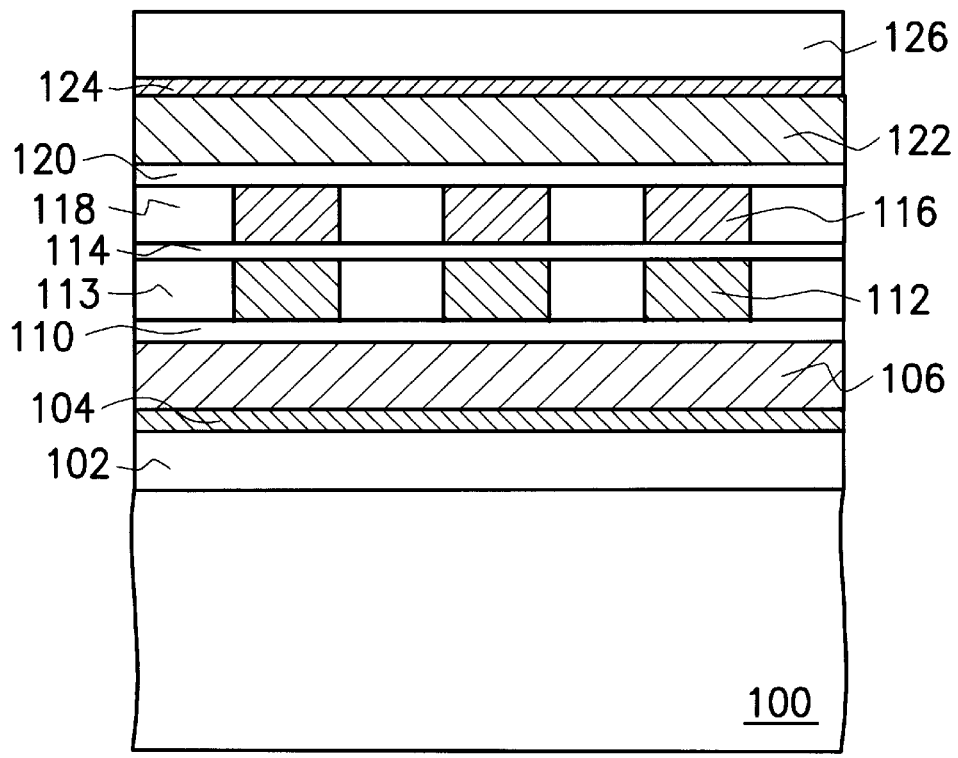
FIG. 2 is a cross-sectional schematic diagram taken along bisecting line I—I in FIG. 1C.
Figure 3:
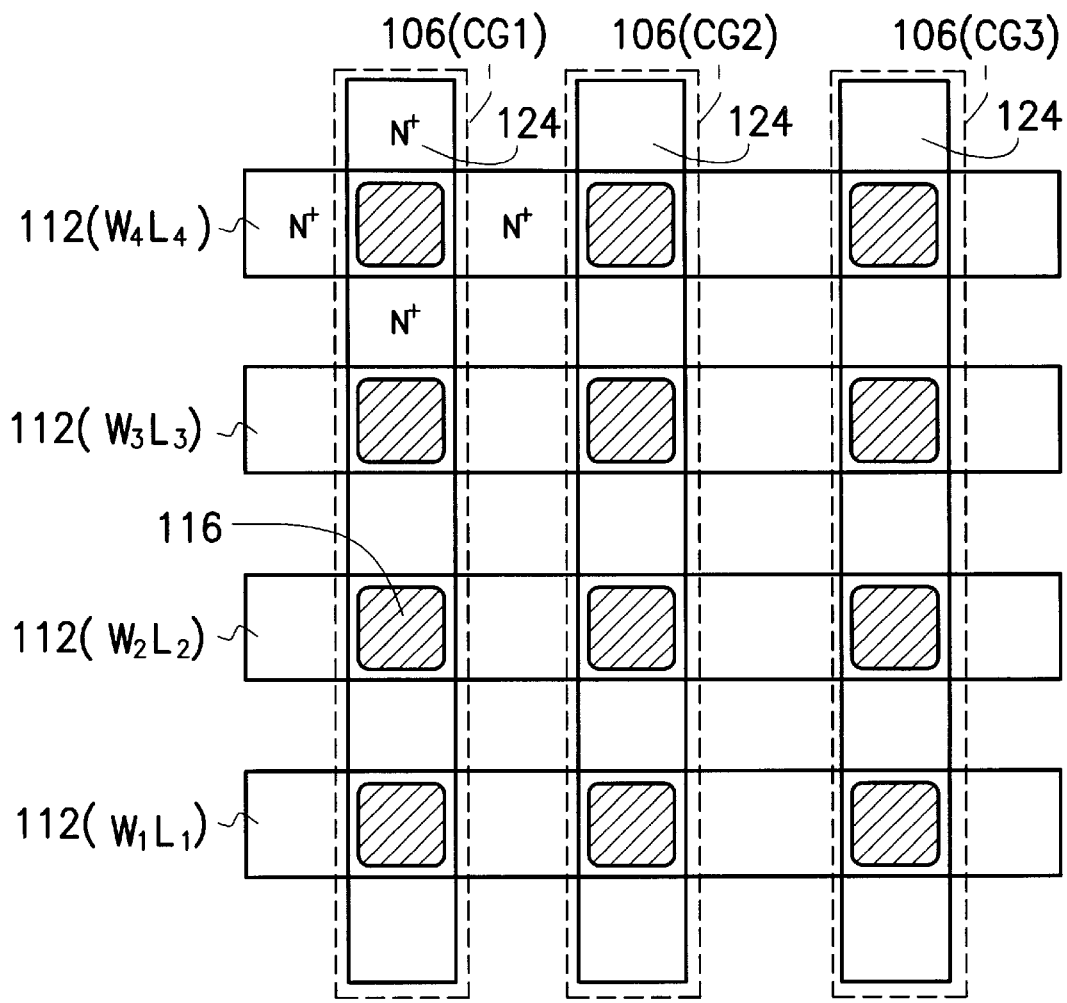
FIG. 3 is a schematic top view of the three-dimensional flash array structure according to one preferred embodiment of this invention.

The process steps mentioned above can be repeated to expand the structure volumetrically. FIG. 2 and FIG. 3 respectively show the schematic, cross-sectional view taken along the bisecting line I—I in FIG. 1C and the schematic, top view of the three-dimensional flash array structure. Since the structure in the invention can be expanded volumetrically, a memory cell array structure with a large capacity can be manufactured.

The fabrication method for the three-dimensional flash array structure above shows only one preferred embodiment of the invention. Alternatively, the three-dimensional flash array structure can be manufactured in a reverse fashion, where the bit lines are formed before fabricating the floating gates, the word lines, and the control gates, in sequence. As a result, the control gates are located above the three-dimensional flash array structure and shared between two structures, so that process steps as well as the height of the structure are reduced.

According to the three-dimensional flash array structure disclosed in the invention, it is not necessary to fabricate LOCOS or STI nor is it necessary to pre-define the well in the substrate. Thus, the process steps are reduced.

Figure 4:
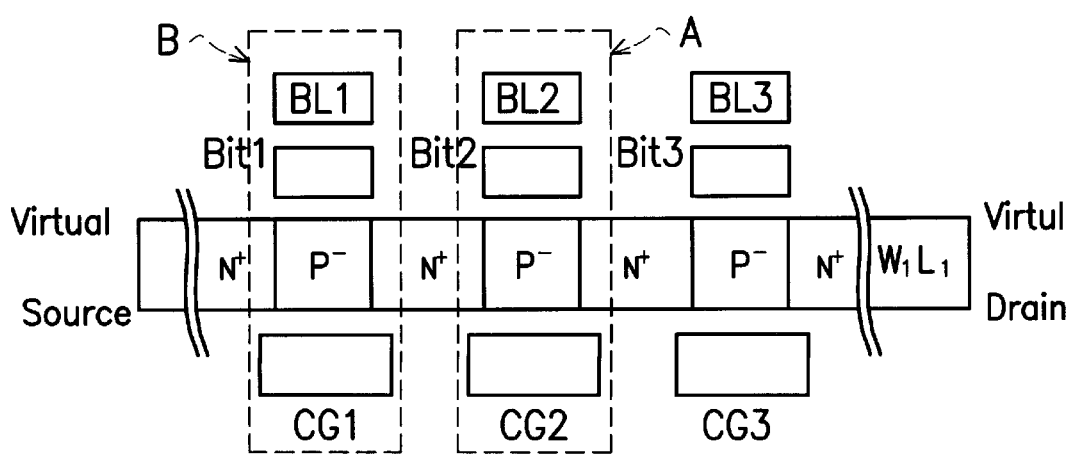
FIG. 4 is a diagram illustrating the operation of the memory cell according to one preferred embodiment of this invention.

According to the invention, the three-dimensional flash array structure adopts a FN tunneling to perform erasing and programming, where an address (selected bit) is assigned. The operations for erasing, programming, and reading are illustrated in Table 1 below with reference to FIG. 4 and the memory cell A as an example:

TABLE 1

|  | Erasing (drawing electrons from bit 2 to $W_1L_1$) | Programming (drawing electrons from $W_1L_1$ to bit 2) | Reading |
| --- | --- | --- | --- |
| Bit line (BL1) | Off (0 V) | Off (0 V) | Off (0 V) |
| Bit line (BL2) | High negative voltage | High positive voltage | High positive voltage |
| Bit line (BL3) | Off (0 V) | Off (0 V) | Off (0 V) |
| Control gate (CG1) | On (V = $V_{cc}$) | On (V = $V_{cc}$) | On (V = $V_{cc}$) |
| Control gate (CG2) | Off (0 V) | Off (0 V) | Off (0 V) |

TABLE 1-continued

|  | Erasing (drawing electrons from bit 2 to $W_1L_1$) | Programming (drawing electrons from $W_1L_1$ to bit 2) | Reading |
|---|---|---|---|
| Control gate (CG3) | On (V = $V_{cc}$) | On (V = $V_{cc}$) | On (V = $V_{cc}$) |

When the memory cell A is programmed, electrons are drawn from $W_1L_1$ to bit 2 for storage. This operation involves maintaining bit lines BL1 and BL3 in an off state, applying a high positive voltage to the bit line BL2, while control gates CG1 and CG3 are in an on state, and the control gate CG2 is in the off state. In this case, virtual source voltage ($V_s$) and virtual drain voltage ($V_d$) of the selected word line are equal and negative voltages, while the $V_s$ and $V_d$ of the unselected word line are equal and positive voltages. Since there is a voltage difference produced between BL2 and CG2, the electrons are drawn from $W_1L_1$ to bit 2 due to the FN tunneling effect. However, in the adjacent memory cell B, the $V_s$ and $V_d$ of the unselected word line are equal and positive voltages, so no FN tunneling occurs to result in programming the memory cell B when the memory cell A is programmed. Thus, a bit by bit assignment can be performed.

When the memory cell A is erased, electrons are drawn from bit 2 to $W_1L_1$. This operation involves maintaining bit lines $BL_1$ and BL3 in an off state, applying a high negative voltage to the bit line BL2, while control gates CG1 and CG3 are in an on state, and the control gate CG2 is in the off state. In this case, $V_s$ and $V_d$ of the selected word line are equal and positive voltages, while the $V_s$ and $V_d$ of the unselected word line are equal and grounded. Since there is a voltage difference produced between BL2 and CG2, electrons in the memory cell A are drawn from bit 2 to $W_1L_1$ due to the FN tunneling effect. However, in the adjacent memory cell B, the $V_s$ and $V_d$ of the unselected word line are equal and grounded, so no FN tunneling occurs to result in erasing the memory cell B. Thus, a bit by bit assignment can be performed.

When the memory cell A is read, its operation involves maintaining bit lines BL1 and BL3 in an off state, while CG1 and CG3 are in an on state, and CG2 is in the off state. The selected word line in this case becomes a virtual MOS, in which a larger threshold voltage ($V_T$) is produced when there are no electrons present in the floating gate, while a smaller $V_T$ is produced when the electrons are present in the floating gate. Thus, the presence or absence of stored electrons in the floating gate is checked by detecting the $V_T$ with a result for determining "1" or "0" indicated in the memory cell.

Summarizing the above, it is understood that the three-dimensional flash array structure and the fabrication method thereof disclosed in the invention have the following advantages. According to the invention, it is not necessary to fabricate LOCOS or STI and a pre-defined well as a part of the flash array structure. Since the structure can be expanded volumetrically, a memory cell array with large capacity can be manufactured in the unit area. Also, the structure can be manufactured in a reverse fashion, so that the control gate can be located on top of the flash array structure and shared between two flash array structures. Since the memory cell array mentioned above is separated from the peripheral circuit and can be made on the glass, the process is simplified and the cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a three-dimensional flash array structure, the method comprising steps of:

forming a first oxide layer on a substrate;

forming a plurality of billet-shaped control gates on the first oxide layer, wherein each of billet-shaped control gates comprises a metal silicide layer and a conducting layer;

forming a first dielectric layer on the billet-shaped control gates and the first oxide layer;

forming a plurality of billet-shaped word lines, wherein an orientation of the billet-shaped word lines is approximately perpendicular to that of the billet-shaped control gates;

forming a second oxide layer on the first dielectric layer between adjacent billet-shaped word lines until a surface of the second oxide layer is approximately level with a surface of the billet-shaped word lines;

forming a tunneling oxide layer on the billet-shaped word lines and the second oxide layer;

forming a plurality of block-shaped floating gates on the tunneling oxide layer, wherein the block-shaped floating gates are located on stacks of the billet-shaped word lines and the billet-shaped control gates;

performing an ion implantation step, with the block-shaped floating gates serving as implantation masks, so that a plurality of first doped regions and a plurality of second doped regions are formed in the billet-shaped word line;

forming a third oxide layer on the tunneling oxide layer on both sides of the block-shaped floating gates until a surface of the third oxide layer is approximately level with a surface of the bolck-shaped floating gates;

forming a second dielectric layer on the block-shaped floating gates and the third oxide layer;

forming a plurality of bit lines on the second dielectric layer, wherein each of the bit lines comprises a conducting layer and a metal silicide layer, and the bit lines are approximately parallel to the billet-shaped control gates; and forming a planarized polysilicon dielectric layer on the second dielectric layer for completely covering the bit lines.

2. The fabrication method of claim 1, wherein the method for forming the billet- shaped control gates further comprises steps of:

forming a first oxide layer on a substrate;

depositing a metal silicide layer and a conducting layer in sequence on the first oxide layer;

patterning the metal silicide layer and the conducting layer so as to form the billet-shaped control gates;

forming a second oxide layer on the first oxide layer on both sides of the billet-shaped control gates until the surface of the second oxide layer is approximately level with the surface of the billet-shaped control gates.

3. The fabrication method of claim 1, wherein the method for forming the billet-shaped control gates further comprising:

forming an oxide layer on a substrate;

patterning the oxide layer, so that a plurality of billet-shaped openings are formed in the oxide layer; and filling the openings with a metal silicide layer and a conducting layer in sequence to form the billet-shaped control gates.

4. The fabrication method of claim 1, wherein the substrate includes a silicon substrate.

5. The fabrication method of claim 1, wherein the substrate includes a glass.

6. The fabrication method of claim 1, wherein the metal silicide layer includes a tungsten silicide layer.

7. The fabrication method of claim 1, wherein the conducting layer includes a polysilicon layer.

8. The fabrication method of claim 1, wherein the first dielectric layer includes an oxide/nitride/oxide (ONO) layer.

9. The fabrication method of claim 8, wherein the method for forming the first dielectric layer includes thermal oxidation.

10. The fabrication method of claim 1, wherein the billet-shaped word line includes a polysilicon layer.

11. The fabrication method of claim 1, wherein the block-shaped floating gate includes a polysilicon layer.

12. The fabrication method of claim 1, wherein the bit line includes a polysilicon layer.

13. The fabrication method of claim 1, wherein the second dielectric layer includes an ONO layer.

14. The fabrication method of claim 13, wherein the method for forming the second dielectric layer includes thermal oxidation.

* * * * *